United States Patent
Lee (10) Patent No.: US 7,919,780 B2
(45) Date of Patent: Apr. 5, 2011

(54) SYSTEM FOR HIGH EFFICIENCY SOLID-STATE LIGHT EMISSIONS AND METHOD OF MANUFACTURE

(75) Inventor: Cheng Tsin Lee, Richmond, CA (US)

(73) Assignee: DiCon Fiberoptics, Inc., Richmond, CA (US)

(*) Notice: Subject to any disclaimer, the term of this patent is extended or adjusted under 35 U.S.C. 154(b) by 115 days.

(21) Appl. No.: 12/186,165

(22) Filed: Aug. 5, 2008

(65) Prior Publication Data
US 2010/0032699 A1    Feb. 11, 2010

(51) Int. Cl.
*H01L 29/26* (2006.01)
*H01L 31/00* (2006.01)
*H01L 29/18* (2006.01)
*H01L 33/00* (2010.01)

(52) U.S. Cl. ........... 257/79; 257/13; 257/88; 257/94; 257/E33.001; 257/E33.057

(58) Field of Classification Search ............ 257/13, 257/88, 94, E33.001, E33.057
See application file for complete search history.

(56) References Cited

U.S. PATENT DOCUMENTS

| | | | |
|---|---|---|---|
| 6,420,199 B1 * | 7/2002 | Coman et al. | 438/22 |
| 6,576,933 B2 * | 6/2003 | Sugawara et al. | 257/103 |
| 6,602,764 B2 * | 8/2003 | Linthicum et al. | 438/481 |
| 6,709,883 B2 * | 3/2004 | Yang et al. | 438/47 |
| 6,777,792 B2 * | 8/2004 | Yoshida et al. | 257/678 |
| 7,119,372 B2 * | 10/2006 | Stokes et al. | 257/79 |
| 7,238,622 B2 * | 7/2007 | Atwater et al. | 438/752 |
| 7,697,584 B2 * | 4/2010 | Wierer et al. | 372/45.01 |
| 2005/0074927 A1 * | 4/2005 | Hsieh et al. | 438/143 |
| 2006/0014310 A1 * | 1/2006 | Epler et al. | 438/22 |
| 2008/0197369 A1 * | 8/2008 | Batres et al. | 257/98 |
| 2010/0102343 A1 * | 4/2010 | Ono et al. | 257/98 |

FOREIGN PATENT DOCUMENTS

| | | | |
|---|---|---|---|
| JP | 2003086836 A | * | 3/2003 |
| JP | 2007227895 A | * | 9/2007 |

* cited by examiner

*Primary Examiner* — Ida M Soward
(74) *Attorney, Agent, or Firm* — Davis Wright Tremaine LLP (57) ABSTRACT

In one embodiment of the invention, a bonding material is used to bond a substitute substrate to the LED, wherein the bonding material does not including gold or tin. The bonding material preferably includes gallium (Ga), such as a combination of Ga and Al or Cu. This bonding material has high thermal conductivity, high strength, high temperature stability and is low cost. In another embodiment of the invention, the substitute substrate is first thinned before it is bonded to the LED structure, so that the substitute substrate is flexible and conforms to the shape of the LED structure. In yet another embodiment of the invention, an apparatus is used for bonding a substitute substrate to a LED which includes a plurality of semiconductor epitaxial layers, said semiconductor epitaxial layers having been grown on the growth substrate so that said semiconductor epitaxial layers are curved in shape. The apparatus includes a conduit for evacuating a region near the substitute substrate on a side of the substitute substrate that is opposite to that of said semiconductor epitaxial layers. Gas pressure is applied on the semiconductor epitaxial layers, and the substitute substrate conforms to the shape of said semiconductor epitaxial layers as a result of pressure applied. A bonding material is used for bonding said substitute substrate to the semiconductor epitaxial layers.

12 Claims, 8 Drawing Sheets

SYSTEM FOR HIGH EFFICIENCY SOLID-STATE LIGHT EMISSIONS AND METHOD OF MANUFACTURE

CROSS REFERENCE TO RELATED APPLICATIONS

This application is related to the application entitled: "HIGH LIGHT EFFICIENCY SOLID-STATE LIGHT EMITTING STRUCTURE AND METHODS TO MANUFACTURING THE SAME," by Lee et al., application Ser. No.: U.S. Ser. No. 11/777,987 filed on Jul. 13, 2007, which claims the benefit of the benefit of U.S. provisional patent application No. 60/937,245 entitled "High Light Efficiency Solid-State Light Emitting Structure And Methods To Manufacturing The Same", filed on Jun. 25, 2007. Both of the above applications are incorporated herein by reference in their entireties.

BACKGROUND OF THE INVENTION

Over the last decade, the advent of solid-state lighting has led to rapid advances in the production of high brightness Light Emitting Diode (LED). LED's brightness is now competing with incandescent and fluorescent light sources mainly due to breakthroughs on chip structures, improved extraction and thermal management of LED lighting system.

The light extraction efficiency reflects the ability of photons emitted inside the LED chip to escape into the surrounding medium. For example, the index of refraction of Gallium phosphide-based materials is close to 3.4, compared with 1 for air and 1.5 for epoxy. This results in a critical angle of 17° for air and 25° in epoxy, respectively. If a single interface is considered only 2% of the incident light into air and 4% into epoxy will be extracted. As a comparison, the index of refraction of Gallium nitride-based materials is close to 2.3. This results in a critical angle of 26° into air and 41° into epoxy. If a single interface is considered only 5% of the incident light into air and 12% into epoxy will be extracted. The rest is reflected into the semiconductor where it will eventually be reabsorbed or recycled and results in the performance degradation of the device.

While light extraction efficiency is an important consideration in the design of LEDs, other factors may also be important. For example, to ensure that the entire active layer in the LED is utilized in light emission, it is desirable to spread the electrical current to the entire active layer. To enhance the efficient use of electrical current in light generation, the ohmic contact resistance with the LED should also be as low as possible. To enhance light extraction, the layers between the active layer and the emitting surface of the LED should have high light transmission characteristics. In addition, in order to efficiently reflect light generated by the active layer traveling in directions away from the light emitting surface of the LED, the different layers of the light reflector employed should have high index contrast.

One type of reflectors for LEDs is proposed in the paper "Omni-Directional Reflectors for Light-Emitting Diodes," by Jong Qyu Kim, et al. Proc. of SPIE Volume 6134, pages D-1 to D-12, 2006. In FIG. 5 of this paper, a GaInN LED with an omni-directional reflector (ODR) is shown. This LED structure comprises a sapphire substrate supporting a GaInN LED. A thin layer of oxidized Ruthenium (Ru) is used as a semi-transparent low-resistance p-type ohmic contact. A quarter-wave thick silicon dioxide low-refractive index layer perforated by an array of silver micro-contacts and a thick silver layer are also employed. In section 3.3.3 on page D-9 of this paper, however, the authors Kim, et al. indicated that the above structure of FIG. 5 is disadvantageous because the above design "needs absorptive semi-transparent current spreading layer, such as $RuO_2$, . . . , which leads to a decrease in reflectivity of the ODR." Furthermore, the refractive index of silicon dioxide is deemed to be not low enough for high refractive index contrast with high-index semiconductor materials, which limits further improvement of light extraction efficiency in GaN-based LEDs.

As an alternative, the authors proposed an ODR structure illustrated in FIGS. 11 and 12 of the paper. In this alternative ODR structure, the oxidized Ruthenium and silicon dioxide layers in FIG. 5 are replaced by an indium-tin oxide (ITO) nanorod low index layer illustrated in FIG. 12 of the paper. However, as illustrated in FIG. 13 of the paper, the ITO nanorod layer provides mediocre ohmic contact characteristics. Moreover, the ITO material reacts strongly with metal, such as silver. When the ITO nanorod layer proposed by Kim, et al. comes into contact with a silver substrate underneath, interdiffusion occurs at the interface which greatly reduces the reflective properties of the resulting structure. This will also greatly reduce the light extraction efficiency of the LED. It is therefore desirable to provide an improved LED structure in which the above-described difficulties are alleviated.

Thermal management has always been a key aspect of the proper use of LEDs. Poor thermal management leads to performance degradation and reduced lifetime of LEDs.

A substrate of high thermal conductivity becomes a necessity for the operation of high power LEDs. It allows heat generated at the chip level to be transferred efficiently away from the chip through the substrate. Given that conventional red (AlGaInP) and blue (InGaN) LED is grown from N+ GaAs and sapphire substrates, respectively, one of the major drawbacks of GaAs and sapphire are their poor thermal conductivity. GaAs and sapphire have thermal conductivity values of 50, and 40 w/m K, respectively. Obviously, replacing GaAs or sapphire with a carrier of high thermal conductivity such as one made of Si (150 W/m□K), Cu (400 W/m□K), or AlSiC (180 W/mK) can significantly improve the LED performance through better heat dissipation.

The substrate from which the LED is grown is referred to herein as the growth substrate. The high thermal conductive substrate from which the LED is transferred to is referred to herein as the substitute substrate.

To create good bonding with growth substrate, it is necessary to have a substitute substrate with CTE closely match with that of growth substrate. In the case of GaN based LED grown from sapphire substrate, the fabrication process introduces considerable compressive stress on the LED due to the slightly higher CTE of sapphire than GaN. When the sapphire substrates are replaced with substitute substrate, the LED may be damaged if such compressive force is released rapidly. It is well known that GaN based LED materials are strong under compression and weak under tensile force. Therefore, it is desirable to preserve the compressive force on the LED to enhance the reliability of LED chips for subsequent thermal processes such as laser lift-off and die bonding. As a result, it is desirable to use a substrate material that has CTE equal to or slightly greater than sapphire substrate (~6 ppm/K) to replace the sapphire growth substrate.

Metal matrix composites are well known material that typically includes a discontinuous particulate reinforcement phase within a continuous metal phase. An example is silicon carbide reinforced aluminum matrix composite, AlSiC, which is made by infiltrating porous silicon carbide with molten aluminum. The AlSiC metal matrix composite system has the positive attributes of high thermal conductivity, low and tailorable coefficient of thermal expansion and high strength. These attributes render AlSiC suitable as a substitute substrate.

Bonding material is another important part of the LED system, since the bonding phase will not only play an important part to the thermal management system but also need to survive the subsequent chip processing processes such as laser lift-off, and die bonding processes. Ideally, the bonding material has high thermal conductivity, high strength, high temperature stability and is low cost. In the case of GaN/sapphire system, the LED growth wafer usually is not smooth, partly due to the inherent stress between sapphire and GaN and partly due to the particulate contamination in the growth process. To fully cover the non-smooth surface of growth wafer, solder bonding method is the preferred method. Among various solder bonding materials, Sn based soft solders are relative cheap but have low strength and low temperature stability; hard solders such as AuSn or AuGe have high strength, high temperature stability but are high cost and have relatively low thermal conductivity. It is therefore desirable to develop a better bonding material that does not have the above shortcomings.

Figure 5:
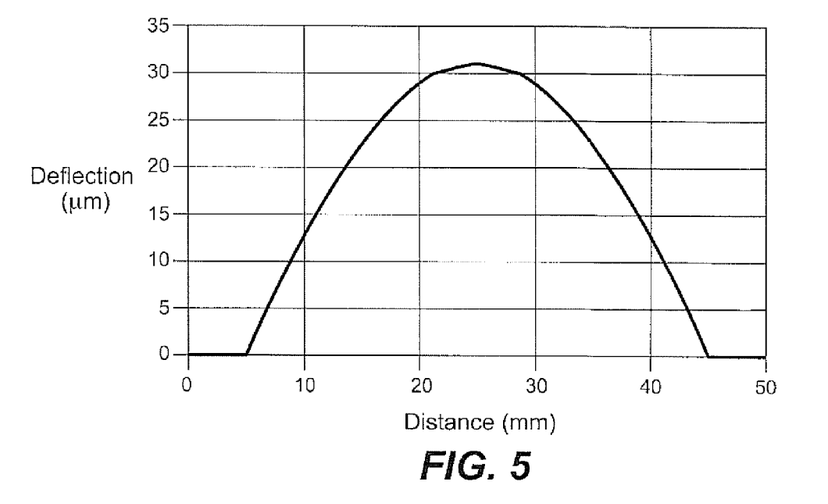
FIG. 5 is a graphical plot of the curvature of GaN grown on sapphire substrate useful for illustrating an embodiment of the invention.

To bond a substitute substrate to a growth substrate, it is necessary to provide good contact between the bonding wafers. In the case of GaN-based LEDs grown from sapphire substrates, the GaN growth process introduces considerable stress on the LED due to the CTE mismatch between sapphire and GaN material. As shown on FIG. 5, the stress created ~30 um curvature from center to the edge of the GaN/sapphire growth wafer. Obviously, it is difficult to generate good bonding between a flat substitute wafer and a curved growth wafer. Poor bonding between growth substrate and substitute substrate will not only result in lower yield during the sapphire removal process but also create reliability problem on LED chips. Commercial wafer bonding devices and techniques are designed to handle flat wafers, not wafers with curved surfaces. It is therefore desirable to develop a better wafer-bonding device/process to overcome the unique bonding problem.

SUMMARY OF THE INVENTION

As noted above, tin (Sn) based soft solders are relative cheap but have low strength and low temperature stability, while hard solders such as gold-tin (AuSn) or gold-germanium (AuGe) have high strength, high temperature stability but are high cost and have relatively low thermal conductivity. Thus, in one embodiment of the invention, a bonding material is used to bond a substitute substrate to the LED, wherein the bonding material does not including gold or tin. The bonding material preferably includes gallium (Ga), such as a combination of Ga and Al or Cu. This bonding material has high thermal conductivity, high strength, high temperature stability and is low cost.

To improve the bonding between the flat substitute substrate and an LED that has a curved shape, in another embodiment of the invention, the substitute substrate is first thinned before it is bonded to the LED structure, so that the substitute substrate is flexible and conforms to the shape of the LED structure. In one implementation of this embodiment, the thinned substitute substrate is bonded to the LED structure by applying pressure between the substitute substrate and the LED structure and heat is applied to the bonding material between them.

In yet another embodiment of the invention, an apparatus is used for bonding a substitute substrate to a LED which comprises a plurality of semiconductor epitaxial layers, said semiconductor epitaxial layers having been grown on the growth substrate so that said semiconductor epitaxial layers are curved in shape. The apparatus comprises a conduit for evacuating a region near the substitute substrate on a side of the substitute substrate that is opposite to that of said semiconductor epitaxial layers. Gas pressure is applied on the semiconductor epitaxial layers, and the substitute substrate conforms to the shape of said semiconductor epitaxial layers as a result of pressure applied. A bonding material is used for bonding said substitute substrate to the semiconductor epitaxial layers.

The above features may be used individually or in combination.

All patents, patent applications, articles, books, specifications, standards, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

BRIEF DESCRIPTION OF THE DRAWINGS

FIGS. 1b-1g are views illustrating possible distributions of the vias in the solid state light emitting structure of FIG. 1a.

Identical components in this application are labeled by the same numerals.

DETAILED DESCRIPTION OF EXEMPLARY EMBODIMENTS

In some of the embodiments of the present invention, a light emitting structure is provided with high light extraction efficiency, as well as high thermal dissipation properties. The structure and manufacturing processes provide three major advantages when compared to existing structures and manufacturing methods:

1. A Composite Reflective Mirror is used to enhance the light extraction efficiency and total brightness output of the light-emitting device.
2. An innovative wafer bonding device/process is used to bond the curved growth substrate with a flat substitute substrate. The process involves using a thin and flexible substitute substrate to conform to the curved growth substrate and using isotropic gas pressure to generate uniform pressure across the wafer surface to create a good bonding between substitute substrate and growth substrate. The light-emitting material is supported by a new substitute substrate that has a CTE equal or slightly higher than the active epi-layers of the device (i.e., the layers of the device that are grown using an epitaxial growth process). The substrate that supports the epi-layers is designed to provide robust mechanical support to the epi-layers as well as high thermal conductivity. Preferably the thermal conductivity of material in the substitute substrate is greater than about 100 W/m degrees Centigrade.
3. A cost effective bonding material that provides bonding between growth substrate and substitute substrates has good thermal and mechanical properties.

Several different factors important in LED fabrication can all be taken into account in one embodiment of a solid-state light emitting structure. In this embodiment, a LED comprising a plurality of semiconductor epitaxial layers is supported by a substitute substrate different from the growth substrate. A current spreading layer between the substitute substrate and the LED and in contact with said LED serves as an ohmic contact with the LED. A buffer layer between the current spreading layer and the substitute substrate comprises a plurality of vias and has a refractive index that is below that of the current spreading layer. A reflective metal layer between the buffer layer and the substitute substrate is connected to the current spreading layer through the vias in the buffer layer.

In the above embodiment, the buffer layer separates the current spreading layer from the reflective metal layer. In the event that the material of reflective metal layer reacts with that of the current spreading layer, the presence of a buffer layer reduces or prevents such reaction. This is the case, for example, where the current spreading layer comprises ITO. Moreover, since the buffer layer has a refractive index that is below that of the current spreading layer, this increases the index contrast of the reflective mirror formed by the buffer layer and the reflective metal layer, and enhances the reflectivity and thus the extraction efficiency of the LED device.

In another embodiment, a solid-state light emitting structure comprising a plurality of semiconductor epitaxial layers grown on a growth substrate may be constructed as follows. A current spreading layer in contact with the LED is formed, where the current spreading layer serves as ohmic contact with the LED. A buffer layer is formed on the current spreading layer, wherein the buffer layer comprises a plurality of holes therein. The buffer layer has a refractive index that is below that of the current spreading layer. A reflective metal layer is formed on the buffer layer and the plurality of holes in the buffer layer are filled with an electrically conductive material to provide vias, so that the reflective metal layer is electrically connected to the current spreading layer through the vias. A substitute substrate in electrical contact with the reflective metal layer is provided to support said LED and the current spreading, buffer and reflective metal layers.

Composite Mirror:

The light emitting structure described in the present invention is a surface-emitting, solid-state light emitting structure, comprising a pn junction light-generating region 100 (referred to as the active area) in FIG. 1 a, which region may include a p-doped layer and an n-doped layer with an interface at 100a. Region 100 is grown on a growth substrate 10 comprising a suitable material such as sapphire or GaAs.

Figure 2:
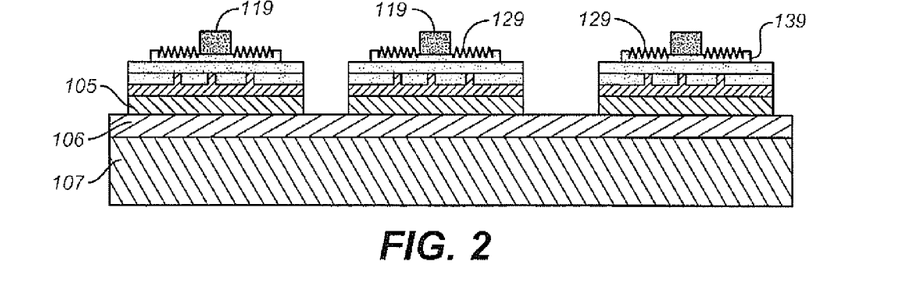
FIG. 2 is a cross sectional view of multiple LED chips with reflector layers on a substitute substrate to illustrate an embodiment of the invention.

Light generated inside the active layers of a light emitting structure such as a light emitting diode is typically isotropically emitted within the epi-layers, meaning that photons are emitted in all directions, more or less equally. The portion of the emitted photons that is emitted in the upper hemisphere of the die is typically efficiently extracted from the device when proper surface texturing 129 is applied to the dies as illustrated in FIG. 2. However, the photons emitted in the lower hemisphere of the device typically reach the bottom interface of the device, and they need to be redirected toward the upper surface of the device at the surface texturing 129 to optimize the light extraction efficiency of the surface emitting device. FIG. 2 also shows the n side metal ohmic contact 119.

Figure 1A:
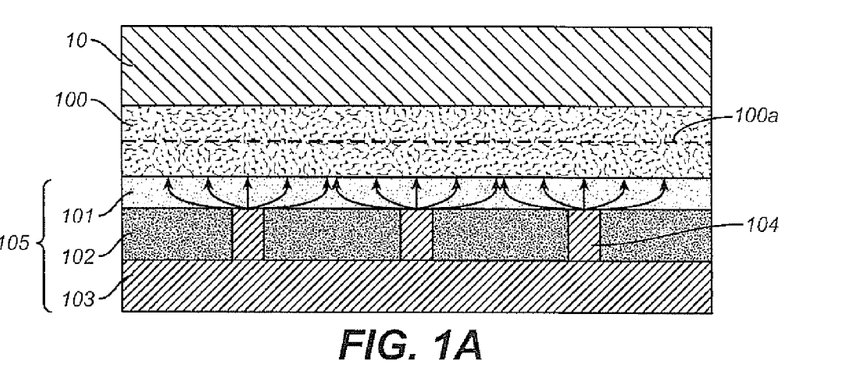
FIG. 1a is a cross sectional view of an LED with reflector layers of a solid state light emitting structure to illustrate an embodiment of the invention.
Figure 1B:
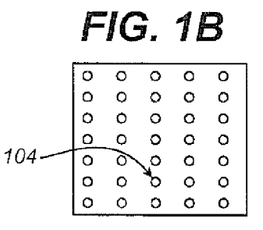
Figure 1C:
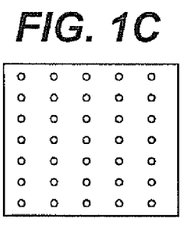
Figure 1D:
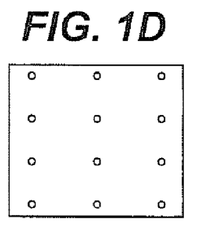
Figure 1E:
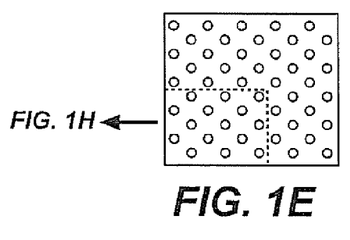
Figure 1F:
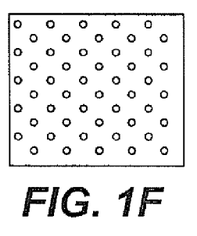
Figure 1G:
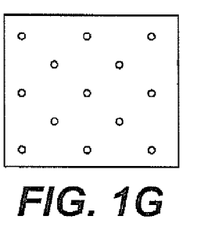

As illustrated in FIG. 1a, the reflecting structure of the present invention 105 includes the following features:

A contact layer 101 is preferably deposited on the p-doped region of the p and n epi-layers 100 to form an ohmic contact. This p-doped contact layer 101 may be formed by the deposition of a stoichiometric Indium Tin Oxide layer (ITO). ITO is a good candidate as the p-contact layer, due to its ability to form an ohmic contact without annealing, its good electrical conductivity, optical transparency, and its relatively high refractive index (1.9). The following materials or combination of the following materials also exhibit the desired properties: Ni/Au and $RuO_2$ for example.

Following deposition of the ITO p-contact layer 101, one or more dielectric layers 102 may be deposited in a sequence on the ITO layer. Localized openings are formed by means of photolithography used in semiconductor manufacturing through the insulating dielectric layer or layers 102 to form an electrical connection between the ITO layer 101 and the metal reflective layer 103.

The reflecting structure is finally capped with a reflective metal layer 103, which may be formed by a deposition process, which not only deposits the metal layer 103 onto the dielectric layer or layers 102, but also fills the openings or holes therein to form vias 104 shown in FIGS. 1a-1h.

Figure 1H:
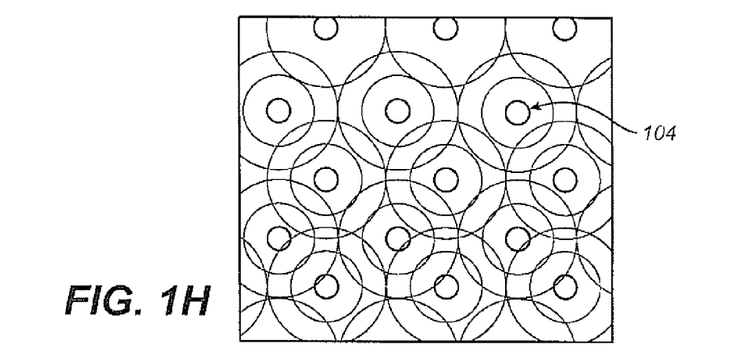
FIG. 1h is an exploded view of a portion of the distribution in FIG. 1e.

In prior devices, the ITO layer acts as a current-spreading layer for spreading current over the entire active region of the LED. In contrast, as illustrated in FIG. 1a, the ITO 101 provides current spreading between two adjacent holes only, not on the entire surface of the device. The lattice structure of the openings, the size of the openings and their diameter are preferably optimized for maximum light extraction efficiency. FIGS. 1b-1g illustrate different possible configurations of the openings or vias 104 networks. FIG. 1h is an exploded view of a portion of the distribution in FIG. 1e.

In one embodiment of the present invention, the thickness of ITO ranges from 10 to 500 nm, the diameter of the openings or vias 104 ranges from 2 to 20 um and the spacing between vias ranges from 5 um to 100 um.

To obtain an optimal reflectivity of the structure, one important surface is the interface with the metallic layer 103. ITO deposition usually induces a rough surface morphology. Therefore the dielectric layers 102 will act as planarization layers and offers a smoother morphology at the interface with the metallic layer 103.

Moreover, ITO has a strong reactivity with metal layers. Even a superficial interdiffusion for example will greatly reduce the reflective properties of the reflective structure.

The structure presented in one embodiment of the present invention provides a solution that reduces the direct contact between the ITO in the reflective metal layers without significant degradation of the electrical properties of the light-emitting device. The dielectric layer or combination of dielectric layers 102 acts as a barrier between the ITO 101 and metal layers 103, and significantly improves the performance of the reflective mirror 105 as well as the reliability of the structure over time. The dielectric layer or layers may comprise material with a lower refractive index than the ITO layer, thereby improving the index contrast of the reflective mirror 105.

In addition, a well-tuned (to a specific optical wavelength range) combination or sequence of dielectric layers 102, combined with an adequately reflective metallic layer, provides an optimal total reflectivity. The resulting composite mirror structure 105 provides a significant performance improvement compared to the prior art. It provides a high reflectivity, low-resistance ohmic contact, composite-mirror structure.

Said dielectric layers 102 may be comprised of oxide(s), nitride(s) or fluoride(s) of any one or more of the following: Si, Nb, Ta, Al, In, Mg, Sn.

The reflective metal layer 103 can be any of the following or an alloy or other combination formed with the following: Au, Al, Ag, Ni, Cu, Pt, Pd, In.

Figure 3:
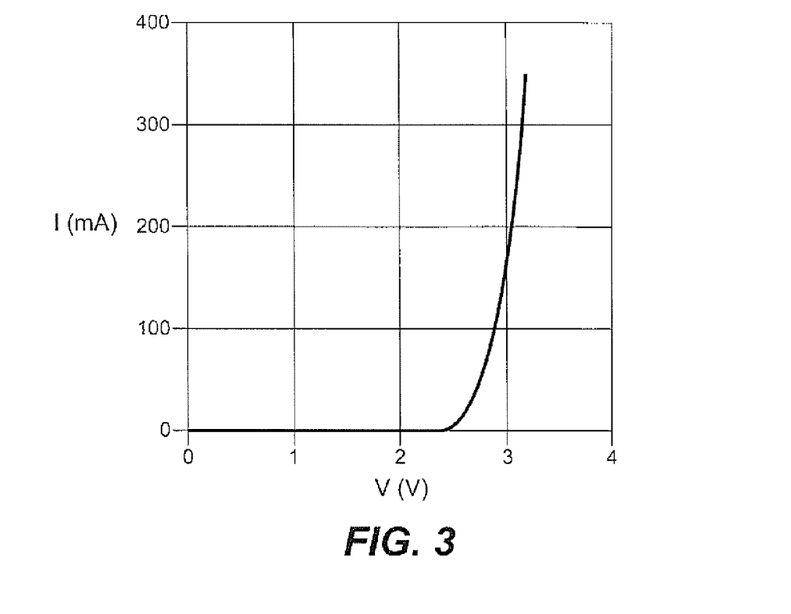
FIG. 3 is a graphical plot of the I-V characteristics of the composite mirror of FIGS. 1a, and 2.

FIG. 3 is a graphical plot of the I-V characteristics of the composite mirror of FIGS. 1a, and 2. As shown in FIG. 3, the composite mirror also has good I-V characteristics, so that the composite mirror does not degrade the function of the ITO as an ohmic p side contact to the LED active region 100.

Figure 4:
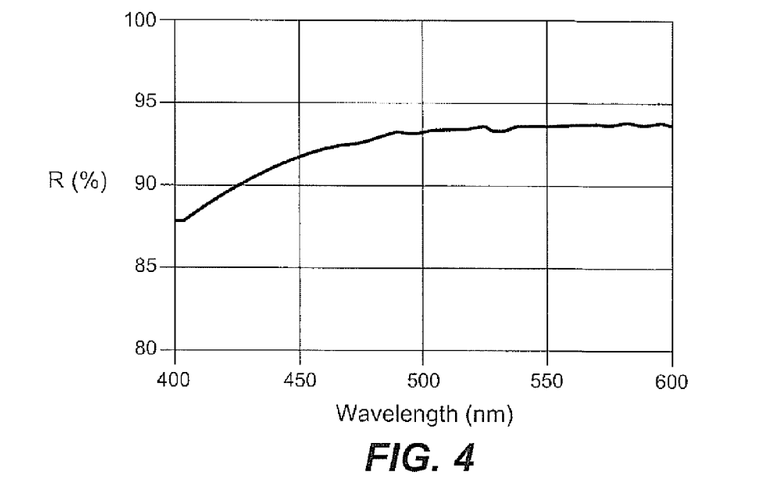
FIG. 4 is a graphical plot of the reflectivity of the composite mirror of FIGS. 1a, and 2.

FIG. 4 is a graphical plot of the reflectivity of the composite mirror of FIGS. 1a, and 2. As shown in FIG. 4, the composite mirror of FIGS. 1a, and 2 has good reflectivity over a range of wavelengths.

Wafer Bonding Device/Process

Following the formation of the composite mirror structure, a substitute substrate is bonded to the growth substrate. As shown on FIG. 5, in the case of GaN grown from sapphire wafer, the growth substrate is curved due to the stress generated from CTE mismatch between GaN and sapphire. To generate good bonding between a flat substitute substrate and a curved growth substrate, one embodiment of the present invention includes:

i. A flexible and thin substitute substrate able to conform to the growth substrate;
ii. A wafer bonding device as shown on FIGS. 6a and 6b that use a vacuum-sealed thin foil (Al, Cu, graphite foil, or polyimide film) to apply uniform gas pressure over the entire wafer surface.
iii. A bonding material that has good thermal and mechanical properties that can perform bonding process at relatively low temperature.

The substrate transfer method of the present invention allows a wide range of choice for the new substitute substrate. The following table lists some candidate materials for such a substitute substrate. As mentioned above, ideally, the substitute substrate should have a CTE equal or slightly higher than the growth substrate to preserve a compressive force over LED chips. Among these carriers, AlSiC, CuW or CuMo are good candidates for this purpose. Thus, the substitute substrate may comprise a metal matrix composite material, where the metal matrix composite material has a CTE equal or slightly higher than the growth substrate materials. In one embodiment, this metal matrix composite material comprises one of the following: AlSiC, CuW and CuMo.

For conforming to the growth substrate during wafer bonding process, the thickness of substitute wafer is reduced for enhanced flexibility. It is worth mentioning that the final thickness of LED chips is typical in the range of 100-200 um. Therefore, thinning of the substitute substrate is necessary before singulation of LED chips. Preferably, the substitute substrate is thinned to a thickness of not more than about 500 microns, or not more than about 200 microns, prior to bonding to the growth substrate with LEDs thereon. However, for easy handling of the bonding wafer after removing the growth substrate, a temporary support can be used.

| Material | CTE (ppm/degree C.) | Thermal conductivity (W/m-degree C.) | Young's modulus (GPa) |
| --- | --- | --- | --- |
| Si | 3 | 150 | 107 |
| Cu | 17 | 400 | 131 |
| Ni | 13 | 91 | 200 |
| Cu(20%)—Mo | 8 | 180 | 313 |
| Cu(20%)—W | 7 | 200 | 367 |
| AlSiC | 6-16 | 170-220 | 188 |

The present invention also allows a wide range of choice for the bonding material. The following table lists some bonding materials. As mentioned previously, bonding material should have high thermal conductivity; good mechanical property and can create good bonding at relatively low temperature. Among these commercial bonding materials, eutectic hard solders such as Au/20Sn, AuSi or AuGe has good mechanical and thermal properties, therefore can be used as bonding material for this application. These hard solders, however, all contain high percentage of gold and therefore are very expensive. In addition, these hard solders need fairly high processing temperature (melting range from 280 to 363 C), which may cause damage to the LED properties such as the reflectivity of the composite mirror.

| System | Composition Wt % | Melting range Solidus | Melting range Liquidus | Coefficient of thermal expansion $10^{-6}$ | Thermal line conductivity J/cm, S, | Tensile strength N/mm$^2$ |
| --- | --- | --- | --- | --- | --- | --- |
| Au—Sn alloy | Au/20Sn | 280(Eutectic) | | 17.5 | 2.5 | 284 |
| | Au/90Sn | 217(Eutectic) | | 13.6 | — | 63 |
| Au—Si alloy | Au/3.15Si | 363(Eutectic) | | 14.9 | 2.9 | 255 |
| | Au/2Si | 363 | 760 | 13.9 | — | — |
| Au—Ge alloy | Au/12Ge | 356(Eutectic) | | 12.0 | 2.6 | 186 |
| | Au/7.4Ge | 356 | 680 | 13.1 | — | — |

-continued

| System | Composition Wt % | Melting range Solidus | Melting range Liquidus | Coefficient of thermal expansion $10^{-6}$ | Thermal line conductivity J/cm, S, | Tensile strength N/mm$^2$ |
|---|---|---|---|---|---|---|
| Reference | Au | 1063 | | 14.2 | — | 131 |
| | Pb/63Sn | 183(Eutectic) | | 24.7 | 0.5 | 48 |
| | Pb/5Sn | 274 | 314 | 28.7 | 0.4 | 93 |

New Bonding Material

Figure 7A:
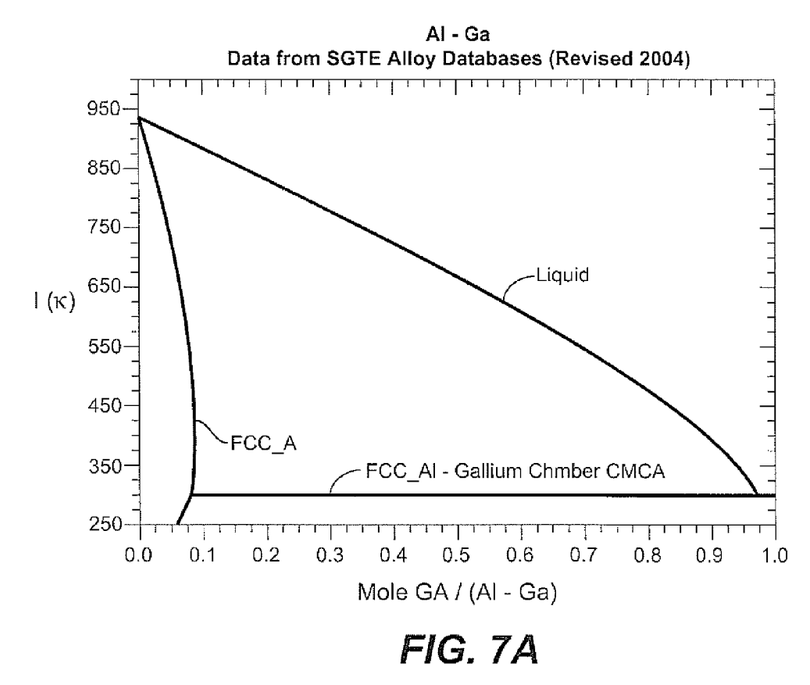
FIGS. 7a and 7b are graphical plots showing binary phase diagrams of Al—Ga and Cu—Ga that illustrate characteristics of new bonding materials for illustrating an embodiment of the invention.
Figure 7B:
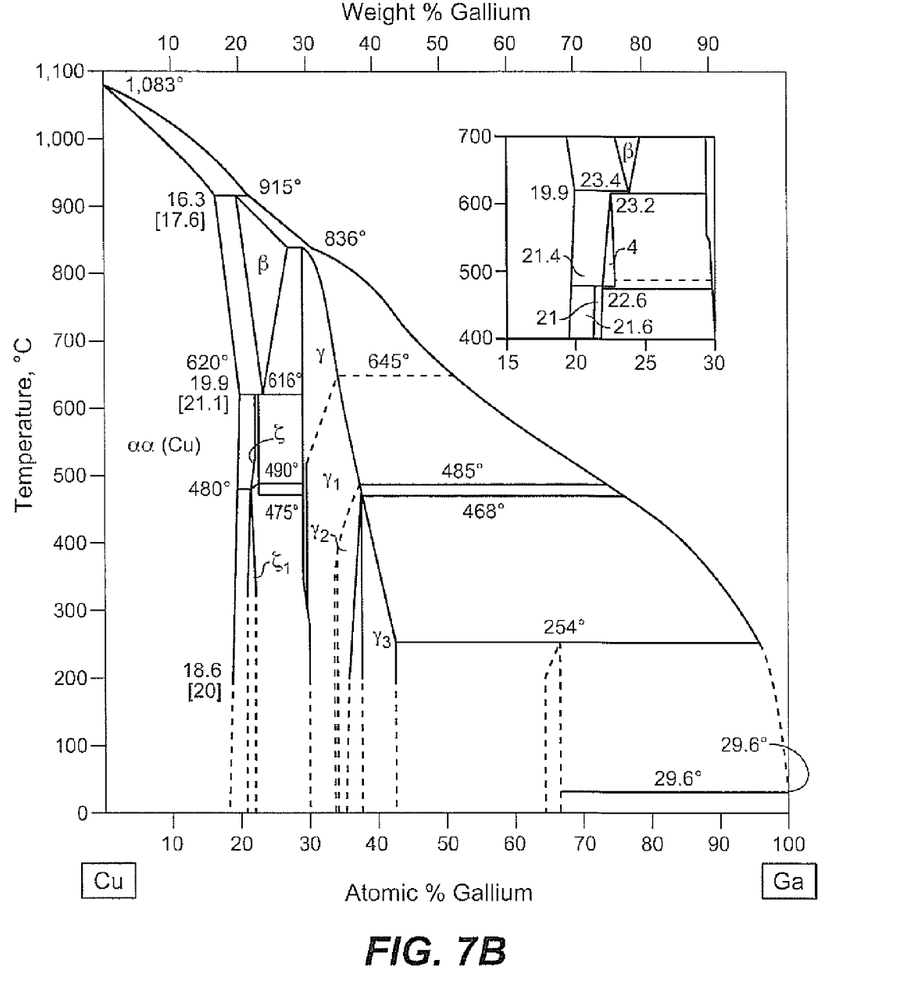

As mentioned above, commercial hard solder such as AuSn (80/20) has good thermal and mechanical properties but are high cost and need relatively high process temperature. A new cost effective bonding material is introduced in one embodiment of the present invention. FIGS. 7a and 7b are binary phase diagrams of Al—Ga and Cu—Ga that illustrate the new bonding materials. The new bonding material takes advantages of the high thermal and mechanical properties of aluminum (Al) and copper (Cu) and use gallium (Ga) to create low temperature bonding process. Heat treatment of the bonding phase above 254° C. will convert low temperature gallium into higher temperature intermetallic phases such as $CuGa_x$ (X<=2) as well as form solid solution with aluminum (up to 10 wt % of Ga can be dissolved in aluminum). This is apparent from FIGS. 7a and 7b. As shown in FIG. 7a, Al—Ga is either in liquid phase, or a mixture of liquid and solid phases except where the amount of Ga is not more than about 10% in weight of the solid solution of Ga with aluminum. The same is true for $CuGa_x$ as shown in FIG. 7b. Where the amount of Ga is more than about 66%, $CuGa_x$ is in liquid phase, or a mixture of liquid and solid phases. Thus, since these compounds or combinations should be in solid phase to be used for bonding the growth and substrate substrates, the amount of Ga is preferably not more than 10% in weight of the solid solution of Ga with aluminum, and not more than 70% in weight in $CuGa_x$.

In the present invention, the growth substrate and the substitute substrate are coated with Al (adhesion layer) and then with copper (used as wetting layer as well as a layer to protect aluminum from oxidation). A thin layer of gallium metal is brushed onto the copper surface to create the bonding. Since the melting temperature of Gallium is ~30° C. and the $CuGa_x$ intermetallic has a melting temperature above 254° C., bonding temperature above 254° C. can convert the low temperature Ga into high temperature intermetallic phases such as $CuGa_x$ as well as solid solution into aluminum, depending on the thickness of the copper layer and whether the Ga will reach the Al layer. If copper is not used to cover the Al layer, than only a solid solution of Ga into aluminum is formed.

After formation of the new supporting substrate, the growth substrate 10 is removed by one of the following methods or a combination of them: wet etching, mechanical grinding, or Laser Lift-Off or LLO. The laser Lift-Off process is a process using selective absorption of a laser radiation to separate the epi-layers from the epitaxial substrate. For example, a pulsed UV-laser is shined through the epitaxial sapphire substrate. The wavelength of the laser radiation is chosen so that the AlInGaN epi-layers absorb the radiation but not the substrate. This absorption leads to a high-temperature decomposition of the epilayers-substrate interface. In the case of AlInGaN epi-layers on a sapphire substrate, the decomposition process generates plasma creating a surpressure of $N_2$ gas and leaving a thin layer of Ga metal behind (melting temperature <30° C.), which allows easy separation of the sapphire substrate. As noted above, heat generated by this process may cause temperature of the LEDs to rise significantly, so that CTE mismatch may cause damage to the LEDs unless the change in stress conditions is managed successfully.

Finally, formation of the upper electrode 119 for the n ohmic contact, surface texturing 129, passivation layer 139, bonding material 106, and substitute substrate 107 as shown in FIG. 2 are performed to increase the light extraction efficiency of the surface-emitting device.

Figure 8A:
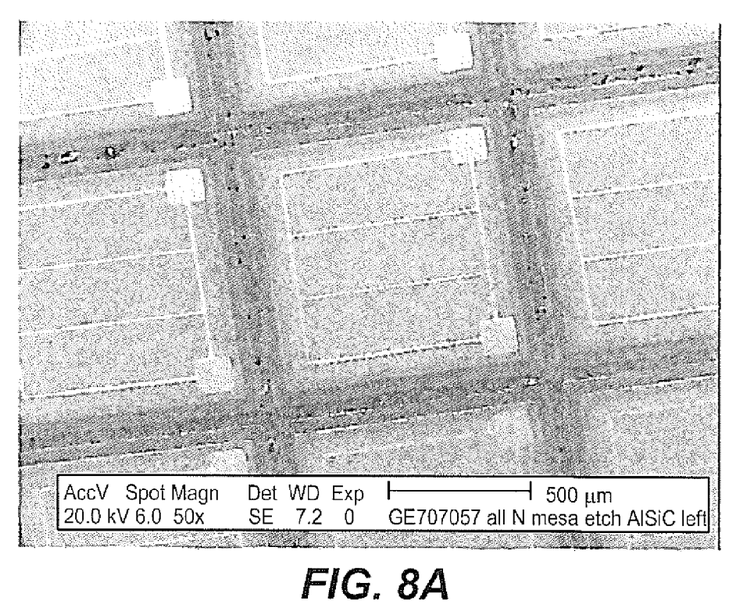
FIGS. 8a and 8b are SEM photographs of a plurality of LEDs before (FIG. 8a) and after (FIG. 8b) singulation, where the LEDs have been processed according to an embodiment of the current invention.
Figure 8B:
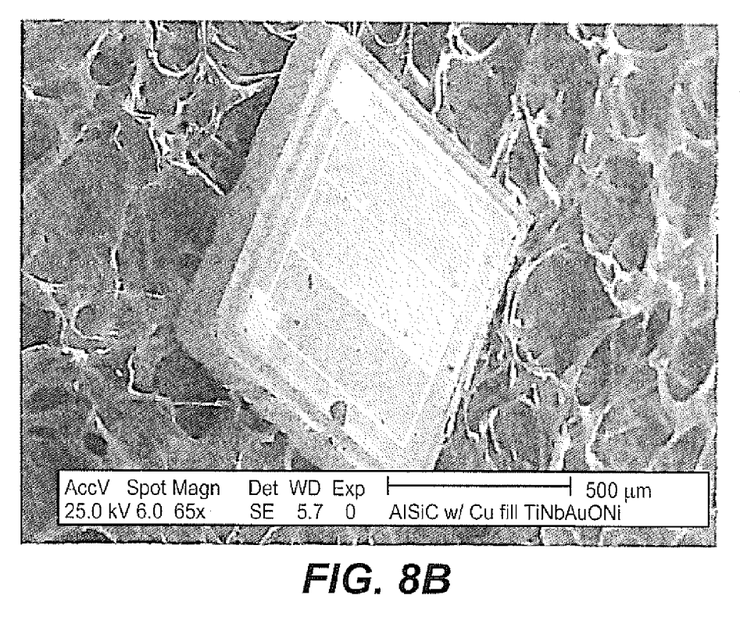

FIGS. 8a and 8b show the SEM photos of LED chips mounted on AlSiC substitute substrate before and after the singulation process.

Figure 6A:
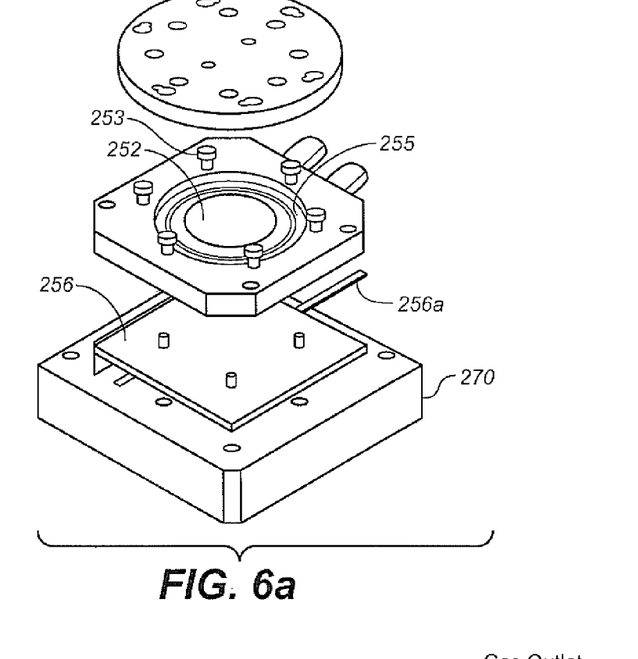
FIG. 6a is an exploded view of some of an apparatus for bonding a substitute substrate to a growth substrate with LED chips thereon.
Figure 6B:
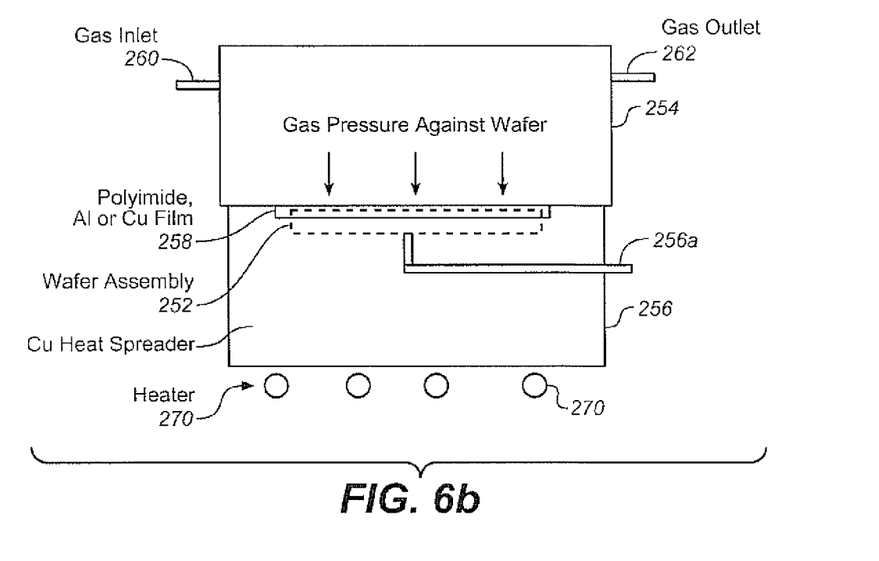
FIG. 6b is a schematic view of the apparatus of FIG. 6a in use for bonding a substitute substrate to a growth substrate.
Figure 9:
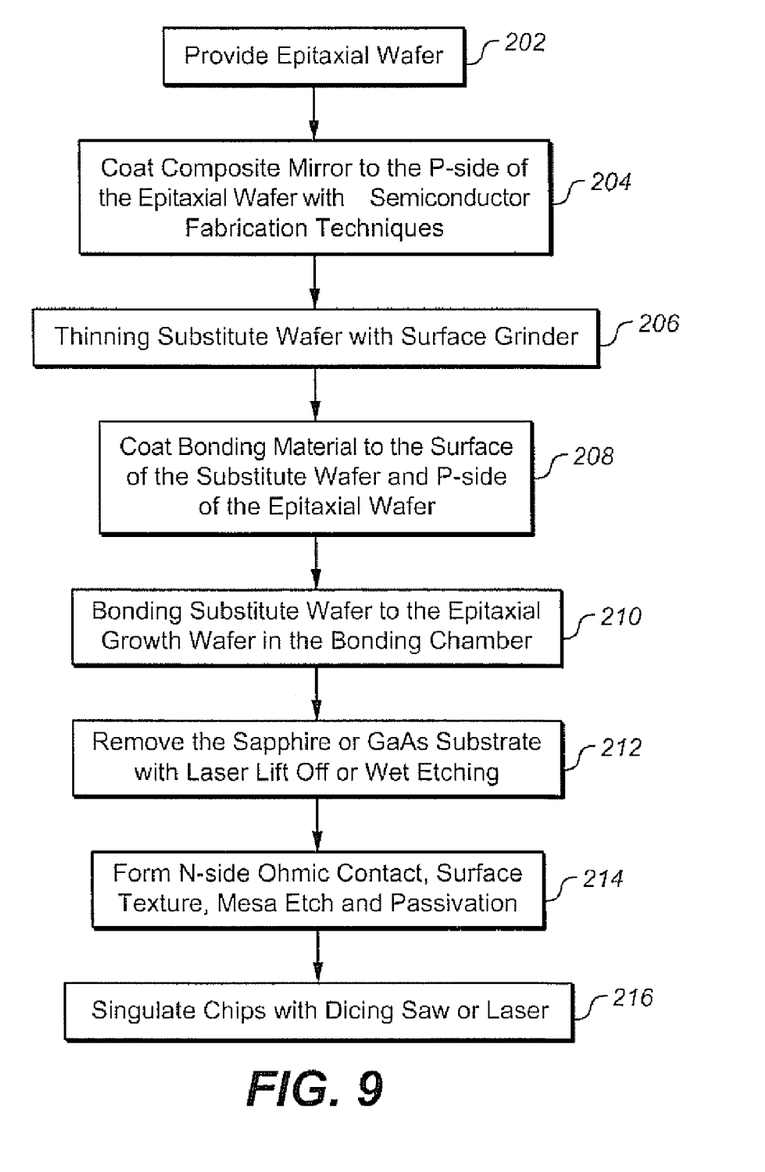
FIG. 9 is a flow chart illustrating a process for making LEDs useful for illustrating an embodiment of the invention.

The process of making the LEDs is illustrated in the flow chart of FIG. 9, in reference to the device or apparatus of FIGS. 6a and 6b. An epitaxial wafer is first provided, where the wafer comprises a growth substrate such as a sapphire or GaAs substrate, with one or more LED structures grown on it. (Block 202, FIG. 9) This epitaxial wafer may comprise only the LED epitaxial layers on the growth substrate and thus only the layers 10 and 100 in FIG. 1a. A composite mirror 105 is coated onto the p-side of the epitaxial wafer, forming the structure shown in FIG. 1a. (Block 204, FIG. 9) The substitute wafer is thinned as described above using a grinder to the desired thickness. (Block 206, FIG. 9) The bonding surface of the substitute wafer and the p-side of the epitaxial wafer are coated with a bonding material, such as a layer of Al, followed by a layer of Cu and then brushed with Ga, which may be in liquid or semi-liquid form at room temperature. (Block 208, FIG. 9) The coated surfaces of the substitute wafer and of the epitaxial wafer are then placed in contact to form a wafer assembly 252 (FIG. 6b) and placed in a bonding and pressure chamber 254 in FIG. 6b. FIG. 6a is an exploded view of the actual bonding device; as shown in the diagram, the gas pressure is maintained by tightening multiple screws 253 against an O-ring (not shown in FIG. 6a) in groove 255 around the wafer assembly 252. The vacuum chamber (conduit 256a and the space between the heat spreader 256 and the substitute wafer, described below) and pressure chamber 254 are separated by a thin foil such as polyimide, Al or Cu foil 258 shown in FIG. 6b (not shown in FIG. 6a).

The wafer assembly 252 is placed on top of a copper heat spreader 256, and covered by a thin foil made of polyimide, Al or Cu 258 which serves as a boundary between the vacuum chamber and pressure chamber 254. Gas is supplied to pressure chamber 254 through inlet 260 and exits through outlet 262, at a pressure preferably from 15 to 200 psi. The pressure is then exerted isotropically onto the epitaxial wafer portion of the wafer assembly 252 through foil 258 towards the thinned substitute wafer. In an alternative embodiment, pressure may be exerted on the substitute wafer towards the epitaxial wafer instead by turning the wafer assembly 252 upside down; all such and other variations are within the scope of the invention.

Heater block 256 (not drawn to scale in FIG. 6b) has a conduit 256a therein through which gas in a region on a side of the substitute wafer in the wafer assembly 252 may be pumped out by means of a vacuum pump (not shown) to reduce the pressure in the conduit 256a and the space between the heat spreader 256 and the substitute wafer. This further accentuates the pressure differential between the chamber 254 and the vacuum chamber underneath the wafer assembly 252, thereby causing the substitute wafer in assembly 252 to flex and conform in shape to the curved shape of the epitaxial wafer. A heater 270 heats the bonding material in the wafer assembly 252 to a desired temperature, causing the combination of Ga with Al and/or Cu to form as described above. (Block 210, FIG. 9) The growth substrate is removed as described above. (Block 212, FIG. 9) The n-side contacts and surface textures are formed, followed by mesa etch on epi layer to ensure P side and N side of the epi are electrically isolated. Finally, a passivation layer is coated over the PN junction to prevent shorting by contaminations. (Block 214, FIG. 9) The resulting wafer is then singulated. (Block 216, FIG. 9)

While the invention has been described above by reference to various embodiments, it will be understood that changes and modifications may be made without departing from the scope of the invention, which is to be defined only by the appended claims and their equivalents.

What is claimed is:

1. A solid-state light emitting structure comprising:
    a LED comprising a plurality of semiconductor epitaxial layers, said semiconductor epitaxial layers having been grown on a growth substrate;
    a substitute substrate different from the growth substrate supporting said LED; and
    a bonding material bonding said substitute substrate to said LED, said bonding material not including gold or tin, wherein said bonding material includes Ga, and a combination of Ga and Al or Cu.

2. The solid-state light emitting structure of claim 1, said bonding material comprising AlGa, wherein amount of Ga in said AlGa is not more than about 10%.

3. The solid-state light emitting structure of claim 1, said bonding material comprising $CuGa_x$, wherein amount of Ga in said $CuGa_x$ is not more than about 70%, x is equal or less than 2.

4. A solid-state light emitting structure comprising:
    a LED comprising a plurality of semiconductor epitaxial layers, said semiconductor epitaxial layers having been grown on a growth substrate;
    a substitute substrate different from the growth substrate supporting said LED; and
    a bonding material bonding said substitute substrate to said LED, said bonding material not including gold or tin, wherein said bonding material includes a solid solution of Ga and Al and an intermetallic phase of Ga and Cu.

5. A solid-state light emitting structure comprising:
    a LED comprising a plurality of semiconductor epitaxial layers, said semiconductor epitaxial layers having been grown on a growth substrate;
    a substitute substrate different from the growth substrate supporting said LED; and
    a bonding material bonding said substitute substrate to said LED, said bonding material not including gold or tin
    a current spreading layer between the substitute substrate and the LED, said current spreading layer in contact with said LED serving as ohmic contact with the LED; and
    a buffer layer between the current spreading layer and the substitute substrate, said buffer layer comprising a plurality of vias, said buffer layer having a refractive index that is below that of the current spreading layer.

6. The solid-state light emitting structure of claim 5, further comprising a reflective metal layer between the buffer layer and the substitute substrate, said reflective metal connected to the current spreading layer through said vias in the buffer layer.

7. The structure of claim 6, said reflective metal layer is any of the following or combination of the following: Au, Al, Ag, Ni, Cu, Pt, and Pd.

8. The structure of claim 5, said current spreading layer is any of the following or combination of the following: ITO, Ni/Au, and $RuO_2$.

9. The structure of claim 5, said buffer layer comprising a dielectric material.

10. A solid-state light emitting structure comprising:
    a LED comprising a plurality of semiconductor epitaxial layers, said semiconductor epitaxial layers having been grown on a growth substrate;
    a substitute substrate different from the growth substrate supporting said LED; and
    a bonding material bonding said substitute substrate to said LED, said bonding material not including gold or tin, said substitute substrate comprising a material with thermal conductivity greater than about 100 W/m degrees Centigrade.

11. The structure of claim 10, said substitute substrate comprising a metal matrix composite material, said metal matrix composite material having a coefficient of thermal expansion equal or slightly higher than the growth substrate materials.

12. The structure of claim 11, said metal matrix composite material comprising one of the following: AlSiC, CuW and CuMo.

* * * * *